(12) United States Patent
Park

(10) Patent No.: US 10,741,114 B2
(45) Date of Patent: Aug. 11, 2020

(54) ELECTROLUMINESCENCE DISPLAY AND METHOD OF MANAGING DEFECTIVE PIXELS THEREON

(71) Applicant: LG DISPLAY CO., LTD., Seoul (KR)

(72) Inventor: Geondo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/181,595

(22) Filed: Nov. 6, 2018

(65) Prior Publication Data

US 2019/0189038 A1 Jun. 20, 2019

(30) Foreign Application Priority Data

Dec. 20, 2017 (KR) .......................... 10-2017-0175985

(51) Int. Cl.
*G09G 3/00* (2006.01)
*G09G 3/3225* (2016.01)
*G09G 3/3291* (2016.01)
*H01L 27/32* (2006.01)

(52) U.S. Cl.
CPC ........... *G09G 3/006* (2013.01); *G09G 3/3225* (2013.01); *G09G 3/3291* (2013.01); *G09G 2310/0297* (2013.01); *G09G 2310/08* (2013.01); *G09G 2320/0242* (2013.01); *G09G 2330/10* (2013.01); *H01L 27/3276* (2013.01)

(58) Field of Classification Search
CPC .... G09G 3/006; G09G 3/3225; G09G 3/3291; G09G 2300/0819; G09G 2310/0297; G09G 2310/08; G09G 2320/0242; G09G 2320/0295; G09G 2330/10; H01L 27/3276
See application file for complete search history.

(56) References Cited

U.S. PATENT DOCUMENTS

| 2007/0001941 | A1* | 1/2007 | Umezaki | G09G 3/006 |
| | | | | 345/77 |
| 2016/0019834 | A1* | 1/2016 | Hall | G09G 3/3208 |
| | | | | 345/212 |
| 2019/0141268 | A1* | 5/2019 | Huang | H04N 9/045 |

FOREIGN PATENT DOCUMENTS

KR 20160024100 A 3/2016

* cited by examiner

*Primary Examiner* — Nelson M Rosario
(74) *Attorney, Agent, or Firm* — Polsinelli PC

(57) ABSTRACT

An electroluminescence display and a method of managing defective pixels thereon are provided. Defective pixels are detected from the pixels, based on sensing results on the electrical characteristics of a driving element, and defect candidates are selected from among the pixels within a compensation range in which the electrical characteristics of the driving element can be compensated by a compensation value obtained based on the sensing results on the electrical characteristics of the driving element.

22 Claims, 9 Drawing Sheets

ELECTROLUMINESCENCE DISPLAY AND METHOD OF MANAGING DEFECTIVE PIXELS THEREON

CROSS-REFERENCE TO RELATED APPLICATION

This application claims the benefit of Korean Patent Application No. 10-2017-0175985 filed on Dec. 20, 2017, the entire contents of which is incorporated herein by reference in its entirety for all purposes as if fully set forth herein.

BACKGROUND

Field of the Disclosure

The present disclosure relates to an electroluminescence display that updates defective pixel information in real time and a method of managing defective pixels thereon.

Description of the Background

Electroluminescence displays can be classified into inorganic light-emitting displays and organic light-emitting displays depending on the material of an emission layer. Of these, an active-matrix organic light emitting display comprises organic light-emitting diodes (hereinafter, "OLED"), which are typical light-emitting diodes that emit light themselves, and has the advantages of fast response time, high luminous efficiency, high brightness, and wide viewing angle.

Pixels on an organic light-emitting display each comprise an OLED and a driving element that drives the OLED by a current supplied to the OLED in accordance with a gate-source voltage. An OLED of an organic light-emitting display comprises an anode, a cathode, and an organic compound layer situated between these electrodes. The organic compound layer consists of a hole injection layer (HIL), a hole transport layer (HTL), an emission layer (EML), an electron transport layer (ETL), and an electron injection layer (EIL). When a power voltage is applied to the anode and cathode, a hole passing through the hole transport layer HTL and an electron passing through the electron transport layer ETL move to the emission layer EML, forming an exciton. As a result, the emission layer EML generates visible light.

The driving element may be implemented as a MOSFET (metal oxide semiconductor field effect transistor) TFT. The electrical characteristics of the driving element should be the same for every pixel, but there may be variations between pixels due to various causes, including process variation, device characteristic variation, etc., and there may be variations with the passage of display driving time. To compensate for variations in the electrical characteristics of the driving element, internal compensation and external compensation may be applied to the electroluminescence display. In the internal compensation method, the threshold voltage of the driving element is sampled, and data voltage is compensated by the threshold voltage of the driving element. In the external compensation method, variations in the electrical characteristics of the driving element between pixels are compensated for by sensing the voltage of each pixel, which varies with the electrical characteristics of the driving element, and modulating data of an input image by an external circuit based on the sensed voltage.

As display driving time elapses, gate bias stress is accumulated on the driving element and degradation of the driving element can progress. Due to the gate bias stress on the driving element, the threshold voltage of the driving element can be shifted.

SUMMARY

Defective pixels on the screen are detected with the eyes through a test process before the shipment of electroluminescence displays, and if the number of defective pixels on a product exceeds a preset permissible level, this product is considered defective. However, more defective pixels may show up as degradation of driving elements progresses after product shipment, and there are no measures for managing pixels with progressive defects.

Accordingly, the present disclosure provides an electroluminescence display that is capable of detecting dark defects in real time after product shipment and managing defective pixel information, and a method of managing defective pixels thereon.

An exemplary aspect of the present disclosure provides an electroluminescence display comprising: a display panel comprising data lines, gate lines intersecting the data lines, and pixels each comprising a driving element for driving a light-emitting diode; a compensation part configured to detect defective pixels from the pixels, based on sensing results on the electrical characteristics of the driving element in each of subpixels of the pixels, obtained by a sensing part connected to the driving element; and memory configured to store a defective pixel information on the defective pixels.

Another exemplary aspect of the present disclosure provides an electroluminescence display comprising: a compensation part that sets a compensation value, based on sensing results on the electrical characteristics of the driving element in each of subpixels of the pixels, obtained by a sensing part connected to the driving element, and selects defect candidates from among the pixels within a compensation range in which the electrical characteristics of the driving element can be compensated by the compensation value; and memory storing defect candidate information comprising the number of defect candidates.

Yet another exemplary aspect of the present disclosure provides method of managing defective pixels on an electroluminescence display, the method comprising: detecting defective pixels from the pixels, based on sensing results on the electrical characteristics of the driving element; setting a compensation value, based on the sensing results on the electrical characteristics of the driving element, and selecting defect candidates from among the pixels within a compensation range in which the electrical characteristics of the driving element can be compensated by the compensation value; and storing a defective pixel information on the defective pixels and defect candidates in a memory.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
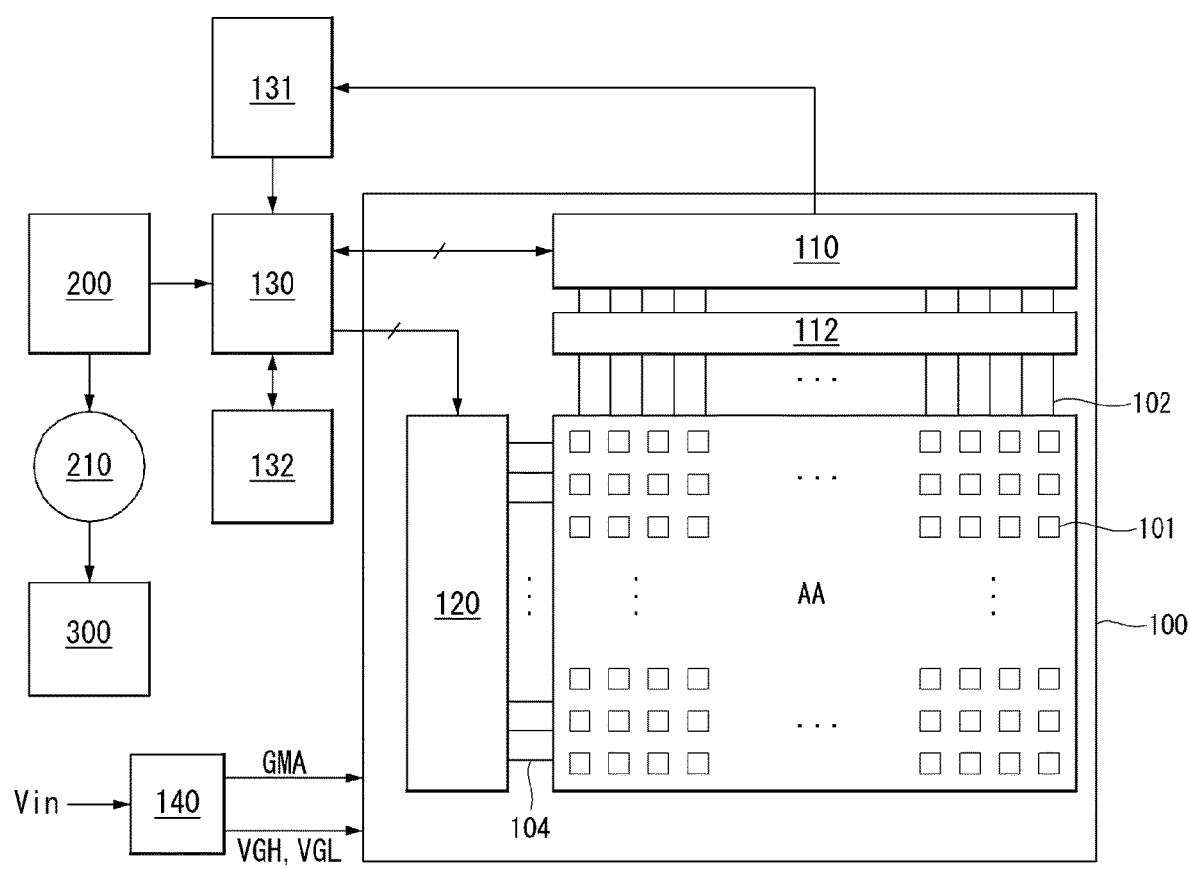
FIG. 1 is a block diagram showing an electroluminescence display according to an exemplary aspect of the present disclosure.

Various aspects and features of the present disclosure and methods of accomplishing them may be understood more readily by reference to the following detailed descriptions of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary aspects of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms "on", "over", "under", "next to" and the like, one or more parts may be positioned between the two parts as long as the term "immediately" or "directly" is not used.

It will be understood that, although the terms first, second, etc., may be used to distinguish one element from another element, the functions or structures of these elements should not be limited by these terms.

The features of various exemplary aspects of the present disclosure may be coupled or combined with one another either partly or wholly, and may technically interact or work together in various ways. The exemplary aspects may be carried out independently or in connection with one another.

In an electroluminescence display of the present disclosure, a pixel circuit may comprise one or more of an n-channel transistor (NMOS) and a p-channel transistor (PMOS). The transistor may be implemented as an oxide transistor having an oxide semiconductor pattern or an LTPS transistor having a low-temperature polysilicon (LTPS) semiconductor pattern. The transistor is a three-electrode device with gate, source, and drain. The transistor may be implemented as a TFT (thin-film transistor) on a display panel. The source is an electrode that provides carriers to the transistor. The carriers in the transistor flow from the source. The drain is an electrode where the carriers leave the TFT. That is, the carriers in the transistor flow from the source to the drain. In the case of the n-channel transistor (NMOS), the carriers are electrons, and thus the source voltage is lower than the drain voltage so that the electrons flow from the source to the drain. In the n-channel transistor (NMOS), current flows from the drain to the source. In the case of the p-channel transistor (PMOS), the carriers are holes, and thus the source voltage is higher than the drain voltage so that the holes flow from the source to the drain. In the p-channel transistor (PMOS), since the holes flow from the source to the drain, current flows from the source to the drain. It should be noted that the source and drain of the transistor are not fixed in position since the source and drain are interchangeable depending on the applied voltage. In the following description, the source and drain of the transistor will be referred to as first and second electrodes.

A gate signal for TFTs used as switching elements swings between gate-on voltage and gate-off voltage. The gate-on voltage is set higher than the threshold voltage of the TFT, and the gate-off voltage is set lower than the threshold voltage of the TFT. The TFT turns on in response to the gate-on voltage and turns off in response to the gate-off voltage. In NMOS, the gate-on voltage may be gate-high voltage VGH, and the gate-off voltage may be gate-low voltage VGL. In PMOS, the gate-on voltage may be gate-low voltage VGL, and the gate-off voltage may be gate-high voltage VGH.

Hereinafter, various exemplary aspects of the present disclosure will be described in detail with reference to the accompanying drawings. In the exemplary aspects below, an electroluminescence display will be described with respect to an organic light-emitting display comprising an organic light-emitting material, but is not limited to it.

An electroluminescence display according to the present disclosure operates in a normal driving mode for displaying an input image on the screen and in a sensing mode for sensing the electrical characteristics of pixels. In the normal driving mode, a display panel drive circuit writes pixel data to pixels in the active portion of every frame, during a display driving period. In the sensing mode, variations in the electrical characteristics of the driving element in every subpixel are compensated for by sensing the electrical characteristics of the driving element and modulating pixel data of an input image by a compensation value based on the sensing results.

Figure 2:
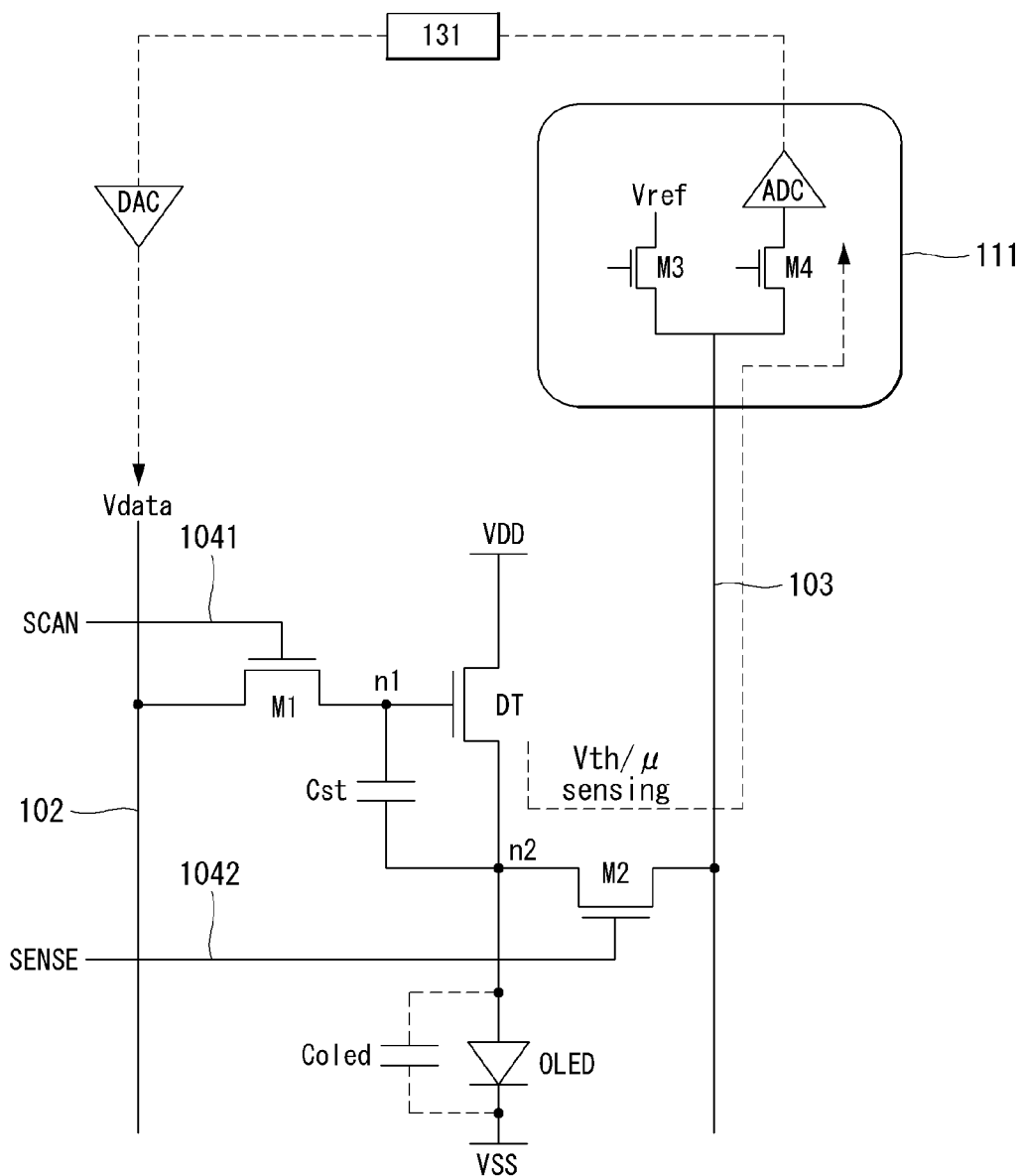
FIG. 2 is a circuit diagram showing an external compensation circuit connected to a pixel circuit.

FIG. 1 is a block diagram showing an electroluminescence display according to an exemplary aspect of the present disclosure. FIG. 2 is a circuit diagram showing an external compensation circuit connected to a pixel circuit.

Referring to FIGS. 1 and 2, the electroluminescence display according to the exemplary aspect comprises a display panel 100 and a display panel drive circuit.

The screen of the display panel 100 comprises an active area AA displaying an input image. A pixel array is arranged in the active area AA. The pixel array comprises a plurality of data lines 102, a plurality of gate lines 104 intersecting the data lines 102, a plurality of sensing lines 103, and pixels arranged in a matrix.

Each pixel may be divided into a red subpixel, a green subpixel, and a blue subpixel for color representation. Each pixel may further comprise a white subpixel. Each subpixel 101 comprises a pixel circuit.

Touch sensors may be placed on the display panel 100. Touch input may be sensed using touch sensors or through the pixels. The touch sensors may be implemented as on-cell type- or add-on type touch sensors which are placed on the screen of the display panel, or as in-cell type touch sensors which are embedded in the pixel array.

The display panel drive circuit 110, 112, and 120 comprises a data driver 110 and a gate driver 120. A demultiplexer 112 may be placed between the data driver 110 and the data lines 102. The demultiplexer 112 may be omitted.

In a normal driving mode, the display panel drive circuit 110, 112, and 120 writes data of an input image to the pixels on the display panel 100 to display an input image on the screen, under control of a timing controller (TCON) 130. The display panel drive circuit 110, 112, and 120 may further comprise a touch sensor driver for driving the touch sensors. The touch sensor driver is omitted in FIG. 1. In a mobile device or wearable device, the data driver 110, the timing controller 130, and a power supply part 140 may be integrated in a single integrated circuit.

When an input voltage Vini is supplied from a host system 200, the power supply part 140 generates electrical power required to drive the timing controller 130, display panel drive circuit 110, 112, and 120, and display panel 100. The power supply part 140 outputs a gamma reference voltage GMA, a gate-high voltage VGH, a gate-low voltage VGL, etc. The gamma reference voltage GMA may be divided into voltages for each gray level, converted to gamma-compensated voltages, and supplied to a digital-to-analog converter (hereinafter, "DAC") of the data driver 110. The power supply part 140 may be implemented as a power IC comprising a charge pump, a regulator, a buck converter, a boost converter, etc.

The data driver 110 converts digital data of an input image, received from the timing controller 130, into gamma-compensated voltages to produce data voltages Vdata. The data voltages Vdata are applied to the pixels through the demultiplexer 112 and the data lines 102.

The demultiplexer 112 is placed between the data driver 110 and the data lines 102 to distribute the data voltages Vdata outputted from the data driver 110 to the data lines 102 by using a plurality of switching elements. A single channel of the data driver 110 is time-divided and connected to the data lines 102 by the demultiplexer 112, thus reducing the number of data lines 102.

The gate driver 120 may be implemented as a GIP (Gate in Panel) circuit, formed directly in a bezel area on the display panel 100, along with a TFT array in the active area AA. The gate driver 120 outputs gate signals to the gate lines 104 under control of the timing controller 130. The gate driver 120 may sequentially supply the gate signals to the gate lines 104 by shifting these signals by a shift register. The gate signals may comprise, but not limited to, a scan signal SCAN and a sensing signal SENSE.

The timing controller 130 receives digital video data DATA of an input image and timing signals synchronized with it from a host system 200. The timing signals comprise a vertical synchronization signal Vsync, a horizontal synchronization signal Hsync, a clock signal DCLK, and a data enable signal DE.

The timing controller 130 may adjust the frame rate to be higher than the input frame frequency. For example, the timing controller 130 may control the operation timing of the display panel drivers 110, 112, and 120 by multiplying the input frame frequency (Hz) by i times (i is a positive integer greater than 0). The frame frequency is 60 Hz in the NTSC (National Television Standards Committee) system and 50 Hz in the PAL (Phase-Alternating Line) system. The timing controller 130 may reduce the frame frequency to between 1 Hz and 30 Hz, in order to lower the refresh rate of the pixels in a low-consumption power driving mode.

The timing controller 130 generates a data timing control signal for controlling the operation timings of the display panel drive circuit 110, 112, and 120 and external compensation circuit 103, 111, and 131, based on the timing signals Vsync, Hsync, and DE received from the host system. The gate timing control signal outputted from the timing controller 130 may be converted to gate-high voltage VGH or gate-low voltage VGL through a level shifter (not shown) and supplied to the gate driver 120. The level shifter converts the low-level voltage of the gate timing control signal to gate-low voltage VGL and converts the high-level voltage of the gate timing control signal to gate-high voltage VGH.

The timing controller 130 or host system 200 serves as a control part that stores and updates defective pixel information and controls defect reports. The timing controller 130 or host system 200 sends a defect report to a service center 300 if the number of progressive defective pixels is greater than a predetermined reference value for defect management.

A compensation part 131 of the timing controller 130 stores information on real-time sensed defective pixels in a non-volatile memory 132b. The defective pixel information is classified into defective pixel information and defect candidate information.

The defective pixel information comprises the number of defective pixels detected before product shipment, the number of defective pixels sensed after product shipment, the positions of defective pixels, and information about whether the display panel is defective or not. Defective pixels are divided into pixel defects and subpixel defects. The defective pixel may be seen as a dark dot on the screen of display panel. The defective pixel information may comprise each pixel's defective pixel information and each subpixel's defective pixel information.

If the number of defective pixels is greater than a preset reference value for defect management, a defect flag indicating a defect may occur. If the defect flag is 1 (high), it means that the number of defective pixels in the display panel is greater than a preset reference value for defect management. The display panel 100 with a defect flag is discarded before product shipment and automatically reported as a defective panel to the service center 300 via a wired/wireless network 210. When a defect flag occurs, the timing controller 130 accesses the defective pixel information stored in the non-volatile memory 132b and automatically sends the defective pixel information to the host system 200.

The compensation part 131 of the external compensation circuit 103, 111, and 131 may detect defective pixels based on real-time sensing results on the driving element. Also, the compensation part 131 may set a compensation value and update the compensation value based on the real-time sensing results on the electrical characteristics of the driving element, and select defect candidates within a compensation range in which the electrical characteristics of the driving element DT can be compensated by the compensation value.

The defect candidate information comprises information on candidate defective pixels which are highly likely to develop into dark or bright dot defects as stress on the driving elements accumulates after product shipment. The defect candidate information may comprise the number of candidate defective pixels, the positions of the candidate defective pixels, and information about whether the display panel is defective or not. The candidate defective pixels are classified into defective pixels and defective subpixels. The defect candidate information may comprise each pixel's information and each subpixel's information.

Figure 10:
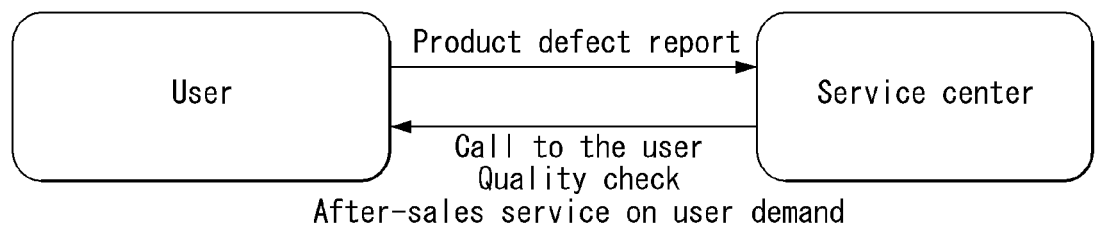
FIG. 10 is a view showing an example in which the user sees a defect report on the screen and requests after-sales service.

If the number of candidate defective pixels is greater than a preset reference value for defect management, a defect predicting flag may occur. If the defect predicting flag is 1 (high), it means that the number of candidate defective pixels on the display panel 100 is greater than a preset reference value for defect management. If a defect predicting flag occurs while the user is using the display device, the display device may automatically issue a defect report to the service center 300 via the wired/wireless network 210, as shown in FIG. 10. When a defect predicting flag occurs, the timing controller 130 may access the defect candidate information stored in the non-volatile memory 132b, and automatically send the defect candidate information to the host system 200. The compensation part 131 of the external compensation circuit 103, 111, and 131 may update the defect predicting flag, along with the defect candidate information, based on defect candidate sensing results obtained in the sensing mode.

The timing controller 130 may access the defective pixel information stored in the non-volatile memory 132b and send it to the host system 200, in response to a request from the host system 200 regardless of whether there is a defect flag or not.

The host system 200 may be one of the following: a TV (television) system, a set-top box, a navigation system, a personal computer PC, a home theater system, a mobile device, and a wearable device. The host system 200 is connected to the service center 300 via the wired/wireless network 210. Upon request from the user or service center 300, the host system 200 may receive defective pixel information from the timing controller 131 and display it to the user or issue a defect report to the service center 300. The defect report may comprise either or both of defective pixel information and defect candidate information.

The user may request defective pixel information via a user interface such as a remote controller, a touch screen, a keypad, etc. Upon receiving a user command about defective pixel information via the user interface, the host system 200 may pass the user command to the timing controller 130 and display defective pixel information on the screen of the display panel 100, or may send the defective pixel information received from the timing controller 130 to a given user's smartphone.

The service center 300 may request the host system 200 for defective pixel information via a wired/wireless network. Upon receiving a request message about defective pixel information from the service center 300, the host system 200 requests the timing controller 130 for defective pixel information and sends the defective pixel information received from the timing controller 130 to the service center 300.

The host system 200 may automatically send defect information received from the timing controller 130 to the service center 300 when a defect flag or defect predicting flag occurs.

As shown in FIG. 2, the external compensation circuit 103, 111, and 131 comprises a sensing line 103 connected to a pixel circuit, a sensing part 111, and a compensation part 131 that receives sensing data (digital data) from the sensing part 111. The DAC of the data driver 110 and the sensing part 111 may be integrated in a source drive IC (integrated circuit) 110a (as in FIG. 3) of the data driver 110. The compensation part 131 may be embedded in the timing controller 130.

The external compensation circuit 103, 111, and 131 may sense the electrical characteristics of the driving element DT by initializing the source voltage of driving element DT and the sensing line 103, i.e., the voltage of a second node n2, to a reference voltage Vref and then sensing the source voltage of the driving element DT. The electrical characteristics of the driving element DT that can be sensed include threshold voltage Vth and mobility $\mu$. In the sensing mode, the sensing part 111 may sample the voltage on the sensing line 103 and convert it into digital data by an analog-to-digital converter (hereinafter, "ADC") to produce sensing data.

The sensing part 111 may comprise an ADC, switching elements M3 and M4, etc. The switching element M3 may supply a predetermined reference voltage Vref to the sensing line 103 to initialize the source voltage of the driving element DT to the reference voltage Vref. The switching element M4 may turn on after the turn off of the switching element M3 to supply the source voltage of the driving element DT to the ADC. The ADC may convert an analog sensing voltage on the sensing line 103 to digital data and send it to the compensation part 131.

The compensation part 131 may sense the mobility $\mu$ of the driving element in each subpixel, based on variation in the source voltage Vs of the driving element during a preset mobility sensing time. The compensation part 131 identifies the gate voltage Vg, i.e., data voltage Vdata, of the driving element in each subpixel as pixel data stored in the memory of the timing controller 130, because the data voltage is applied to the gate of the driving element. The compensation part 131 senses the threshold voltage Vth of the driving element by finding out that Vgs of the driving element DT in each subpixel is equal to Vth based on the difference between pixel data and sensing data.

The compensation part 131 senses variation in the electrical characteristics of the driving element DT in each subpixel and sets a compensation value based on the sensing results. The compensation value is proportional to the variation in the electrical characteristics $\mu$ and Vth of the driving element DT. The compensation value is updated based on real-time sensing results. The compensation part 131 compensates for the electrical characteristics of the driving element DT by modulating pixel data by a compensation value obtained from the sensing results and sending it to the data driver 110 through the timing controller 130. The data driver 110 converts the pixel data modulated by the compensation part 131 into data voltages Vdata and output them to the data line 102. The compensation part 131 may be disposed in the timing controller 130.

As in the example of FIG. 2, the pixel circuit comprises an OLED, a driving element DT connected to the OLED, a plurality of switching elements M1 and M2, and a capacitor Cst. It should be noted that the pixel circuit is not limited to what is shown in FIG. 2. The driving element DT and the switching elements M1 and M2 are implemented as n-channel transistors NMOS in FIG. 2, but not limited to them.

The OLED is a light-emitting diode that emits light by a current generated in accordance with the gate-source voltage Vgs of the driving element DT, which varies with the data voltage Vdata. The OLED comprises an organic compound layer formed between the anode and cathode. The organic compound layer may comprise, but not limited to, a hole injection layer HIL, a hole transport layer HTL, an emission layer EML, an electron transport layer ETL, and an electron injection layer EIL. The anode of the OLED is connected to the driving element DT via the second node n2, and the cathode of the OLED is connected to a VSS electrode to which a low-level power supply voltage VSS is supplied. In FIG. 2, "Coled" denotes the parasitic capacitance of the OLED.

The first switching element M1 turns on in response to a scan signal SCAN and supplies a data voltage Vdata to the gate of the driving element DT connected to a first node n1. The first switching element M1 comprises a gate connected to a first gate line 1041 to which the scan signal SCAN is applied, a first electrode connected to a data line 102, and a second electrode connected to the first node n1.

The second switching element M2 turns on in response to a sensing signal SENSE to supply a reference voltage Vref to the second node n2. The second switching element S2 comprises a gate connected to a second gate line 1042 to which the sensing signal SENSE is applied, a first electrode connected to a sensing line 103 to which the reference voltage Vref is applied, and a second electrode connected to the second node n2.

The driving element DT supplies a current to the OLED in accordance with its gate-source voltage Vgs. The driving element DT comprises a gate connected to the first node n1, a first electrode to which a pixel driving voltage VDD is supplied and a second electrode connected to the anode of the OLED via the second node n2.

The capacitor Cst is connected between the first node n1 and the second node n2. The voltage of the capacitor Cst is Vgs of the driving element DT.

Figure 3:
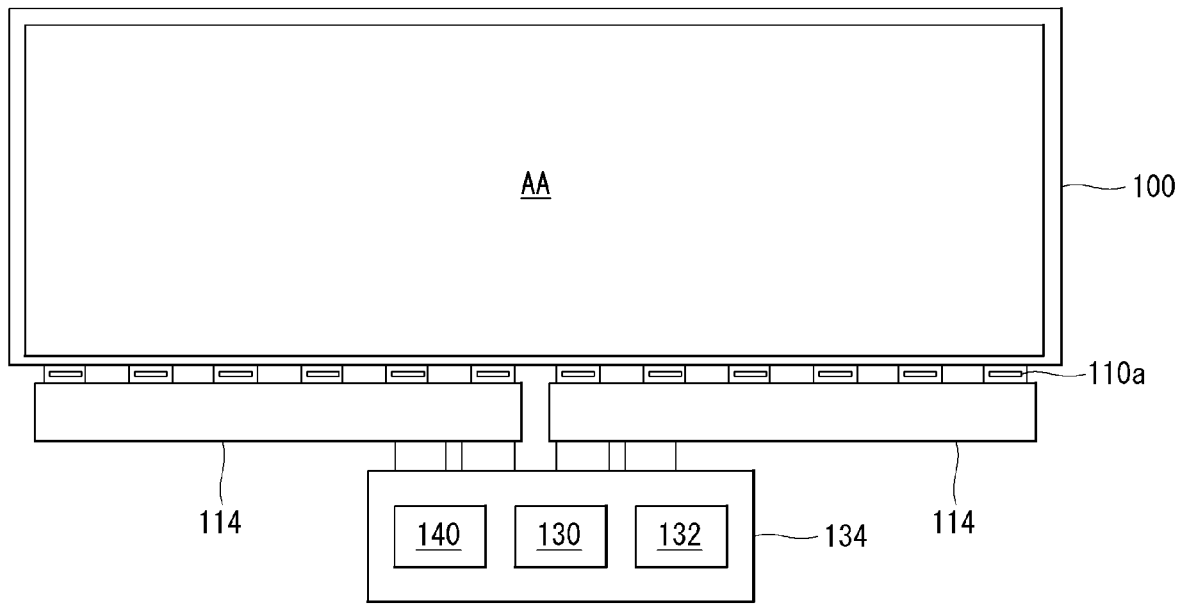
FIG. 3 is a view showing a circuit board connected to a display panel.

FIG. 3 is a view showing a circuit board connected to the display panel 100.

Referring to FIG. 3, the circuit board comprises a source PCB (printed circuit board) 114 connected to source drive ICs 110a. and a control board 134 connected to the source PCB 114. The timing controller 130, memory 132, and power supply part 140 are mounted on the control board 134. The timing controller 130 may comprise the compensation part 131.

Figure 4:
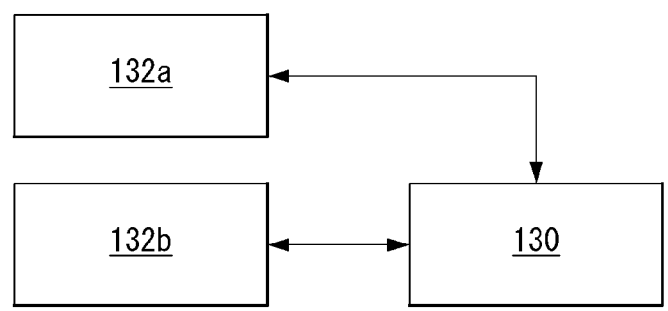
FIG. 4 is a view showing a volatile memory and non-volatile memory connected to a timing controller.

As shown in FIG. 4, the memory 132 may comprise a volatile memory 132a and a writable non-volatile memory (hereinafter, "non-volatile memory") 132b. The volatile memory 132a temporarily stores real-time sensing results and a compensation value while the electroluminescence display is powered on, under control of the timing controller 130. The volatile memory 132a receives the data stored in the non-volatile memory 132b from the timing controller 130 when the electroluminescence display is powered on, and stores real-time sensing results and an updated compensation value in the timing controller 130 before the electroluminescence display is powered off. The timing controller 130 sends data read from the volatile memory 132a to the non-volatile memory 132b and stores the history of subpixel driving, the accumulated value of the sensing results, and the updated compensation value in the non-volatile memory 132b.

The non-volatile memory 132b stores register settings for a timing control signal of the timing controller 130, the history of subpixel driving, variations in the electrical characteristics of the driving elements accumulated based on sensing results, a compensation value updated based on the sensing results, and defective pixel information. The non-volatile memory 132b stores data that needs to be accumulated, because the stored data is not erased even if the electroluminescence display is powered off. The volatile memory 132a may be implemented as DDR (double data rate) RAM but not limited to it, and the non-volatile memory 132b may be implemented as NAND flash memory but not limited to it.

The compensation part 131 of the external compensation circuit may detect progressive defective pixels in real time, caused by a shift in the threshold voltage of the driving element DT after product shipment, by updating the real-time sensing results, compensation value, and defective pixel information and storing them in the non-volatile memory 132b.

The control board 134 is connected to a mainboard of the host system 200. The service center 300 may read defective pixel information by directly accessing the non-volatile memory 132b through a connector of the control board 134.

The electroluminescence display of this disclosure detects defective pixels in real time, based on the sensing results on the driving elements which are obtained by the external compensation circuit 103, 111, and 131 after product shipment. The defective pixels comprise defective pixels in subpixels and defective pixels in pixels. After product shipment, the sensing mode may be divided as in FIG. 5.

Figure 5:
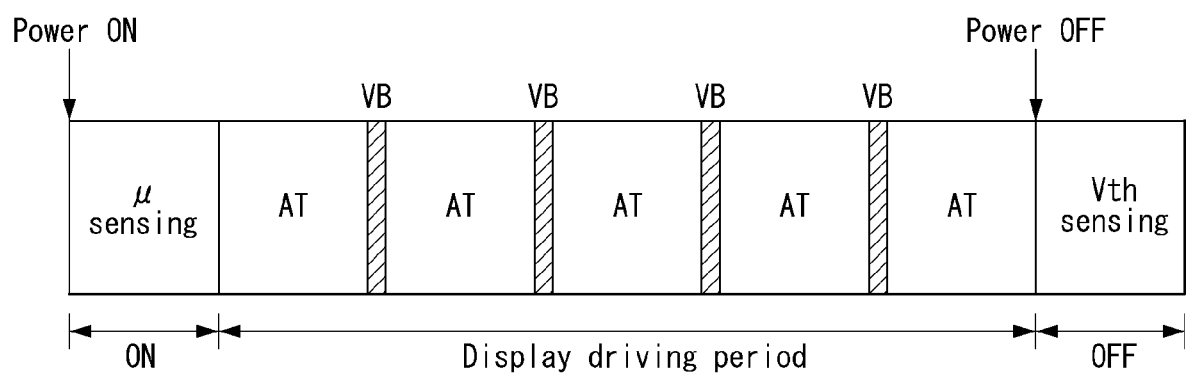
FIG. 5 is a view showing a sensing mode after product shipment.
Figure 6:
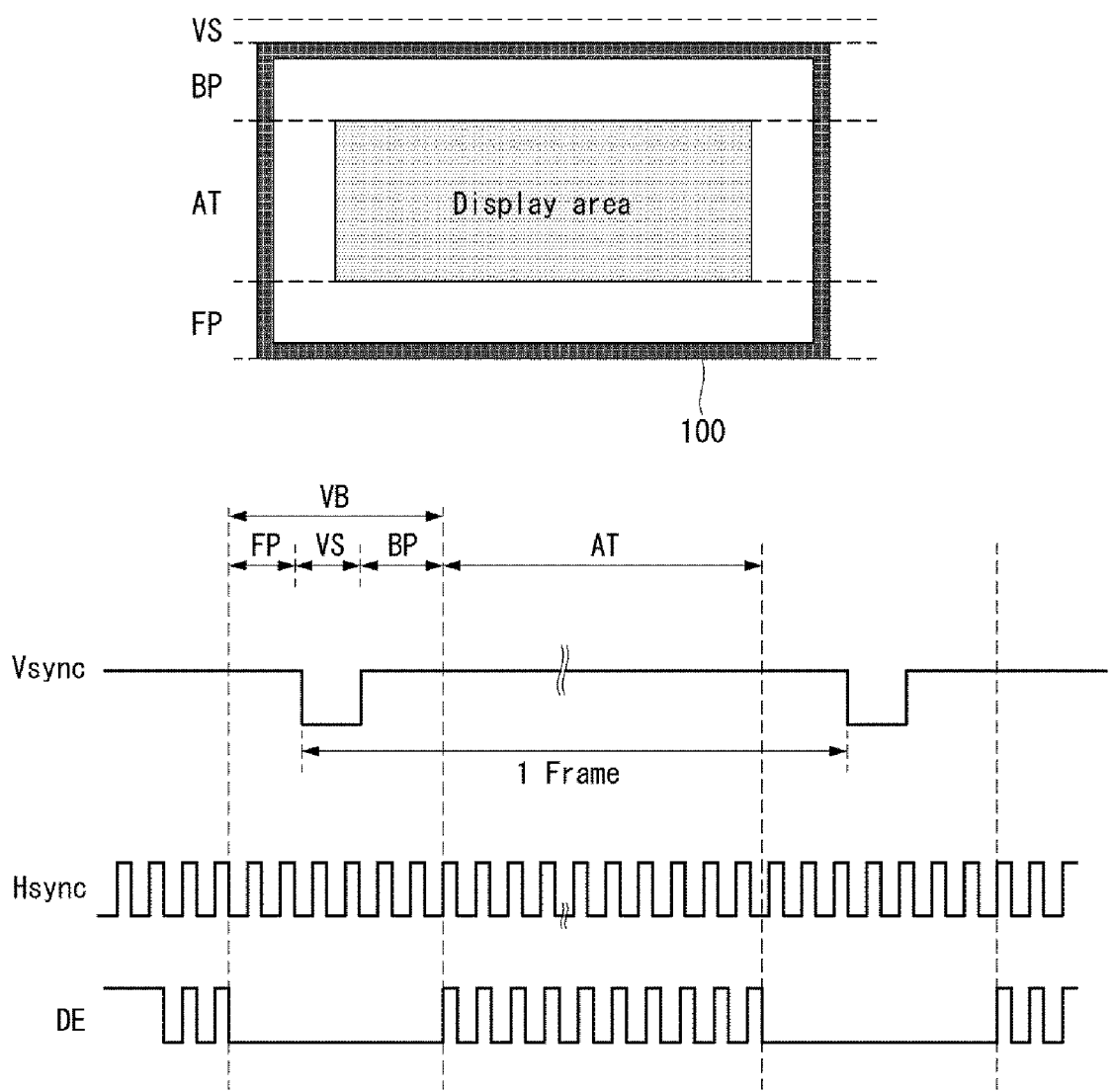
FIG. 6 is a view showing in detail an active interval and a vertical blanking interval.

FIG. 5 is a view showing a sensing mode after product shipment. FIG. 6 is a view showing in detail an active interval AT and a vertical blanking interval VB.

Referring to FIGS. 5 and 6, the sensing mode is divided into before and after product shipment. The threshold voltage Vth and mobility μ of the driving element DT in each subpixel are sensed through a sensing path connected to the pixels before product shipment, and then variations in the electrical characteristics Vth and μ of the driving element DT in every subpixel are compensated for based on the sensing results. In the sensing mode before product shipment, compensation values for the mobility μ and threshold voltage Vth of the driving element DT in each subpixel are stored in the memory 132.

The sensing mode after product shipment comprises a first sensing mode that is carried out in a power-on sequence, a second sensing mode in which the electrical characteristics of the driving element DT are sensed in real time during a display driving mode of the normal driving mode, and a third sensing mode that is carried out in a power-off sequence.

The power-on sequence ON starts when the electroluminescence display is powered on and an input voltage Vin is generated from the host system 200. In the power-on sequence ON, a driving voltage for the display panel drive circuit 110, 112, and 120 and display panel 100 is generated, and the timing controller 130 and the display panel drive circuit 110, 112, and 120 are reset. The external compensation circuit 103, 111, and 131 operate in the first sensing mode immediately after the power-on sequence ON. The external compensation circuit 103, 111, and 131 senses, in real time, the mobility μ of the driving element DT in each subpixel, and updates the compensation value based on the sensing results.

When the first sensing mode is finished, the display panel drive circuit 110, 112, and 120 operates in the normal driving mode to write pixel data of an input image to the pixels on the display panel 100 during the active interval AT of each frame and displays the input image on the screen of the display panel 100. Moreover, the external compensation circuit 103, 111, and 131 executes the second sensing mode during the display driving period of the normal driving mode to sense, in real time, the mobility μ of the driving element DT in each subpixel during the vertical blanking period VB of each frame, and updates the compensation value based on the sensing results.

The power-off sequence OFF starts after a power-off signal for the electroluminescence display is received. In the third sensing mode, the external compensation circuit 103, 111, and 131 senses the threshold voltage Vth of the driving element DT in each subpixel during a preset delay time before the power is shut off in the power-off sequence OFF.

The active interval AT is a period of time during which one frame of data is written to all pixels on the screen. The vertical blanking interval VB is a blank period during which pixel data of an input image is not received between the active interval AT of an (N−1)th frame and the active interval AT of an Nth frame. During the vertical blanking interval VB, data of the next frame (Nth frame data) is not received by the timing controller 130.

A vertical synchronization signal Vsync defines 1 frame. A horizontal synchronization signal Hsync defines 1 horizontal time. A data enable signal DE defines the duration of valid data including pixel data to be displayed on the screen.

The data enable signal DE is synchronized with valid data to be displayed in the pixel array of the display panel 100.1 pulse interval of the data enable signal DE is 1 horizontal time, and the high logic part of the data enable signal DE represents the timing at which pixel data for 1 pixel line is inputted. 1 horizontal time 1H is the time required to write data to 1 pixel line of pixels on the display panel 100.

The timing controller 130 receives the data enable signal DE and data of an input image during the active interval AT. The data enable signal DE and the input image data are not provided during the vertical blanking interval VB. During the active interval AT, 1 frame of data to be written to all the pixels is received by the timing controller 130. 1 frame is the sum of the active interval AT and the vertical blanking interval VB.

As can be seen from the data enable signal DE, no input data is received by the display device during the vertical blanking interval VB. The vertical blanking interval VB comprises a vertical sync time VS, a vertical front porch FP, and a vertical back porch BP.

In the present disclosure, defective pixels are detected based on threshold voltage sensing results on the driving elements, and an accumulate compensation value obtained from the threshold voltage sensing results on the driving elements is updated in the non-volatile memory 132b, thereby detecting progressive defective pixels after product shipment.

Figure 7:
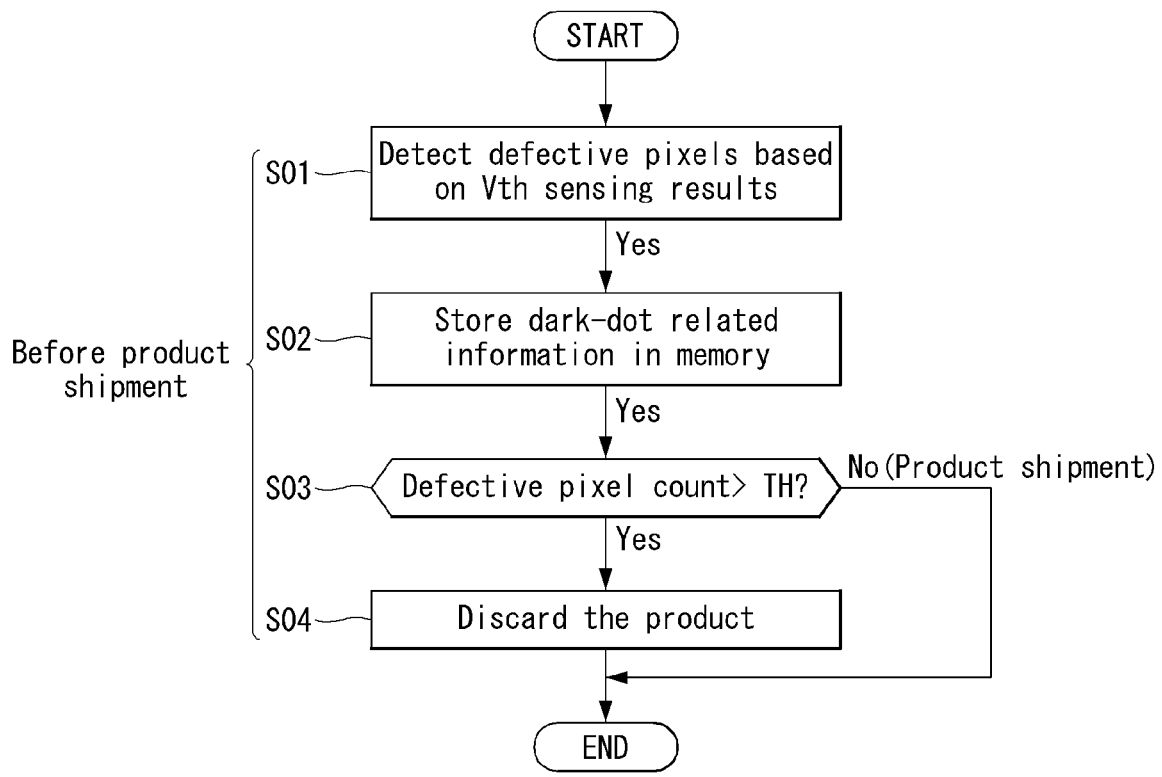
FIG. 7 is a flowchart showing a method of managing defective pixels before product shipment, in an electroluminescence display according to an exemplary aspect of the present disclosure.
Figure 8:
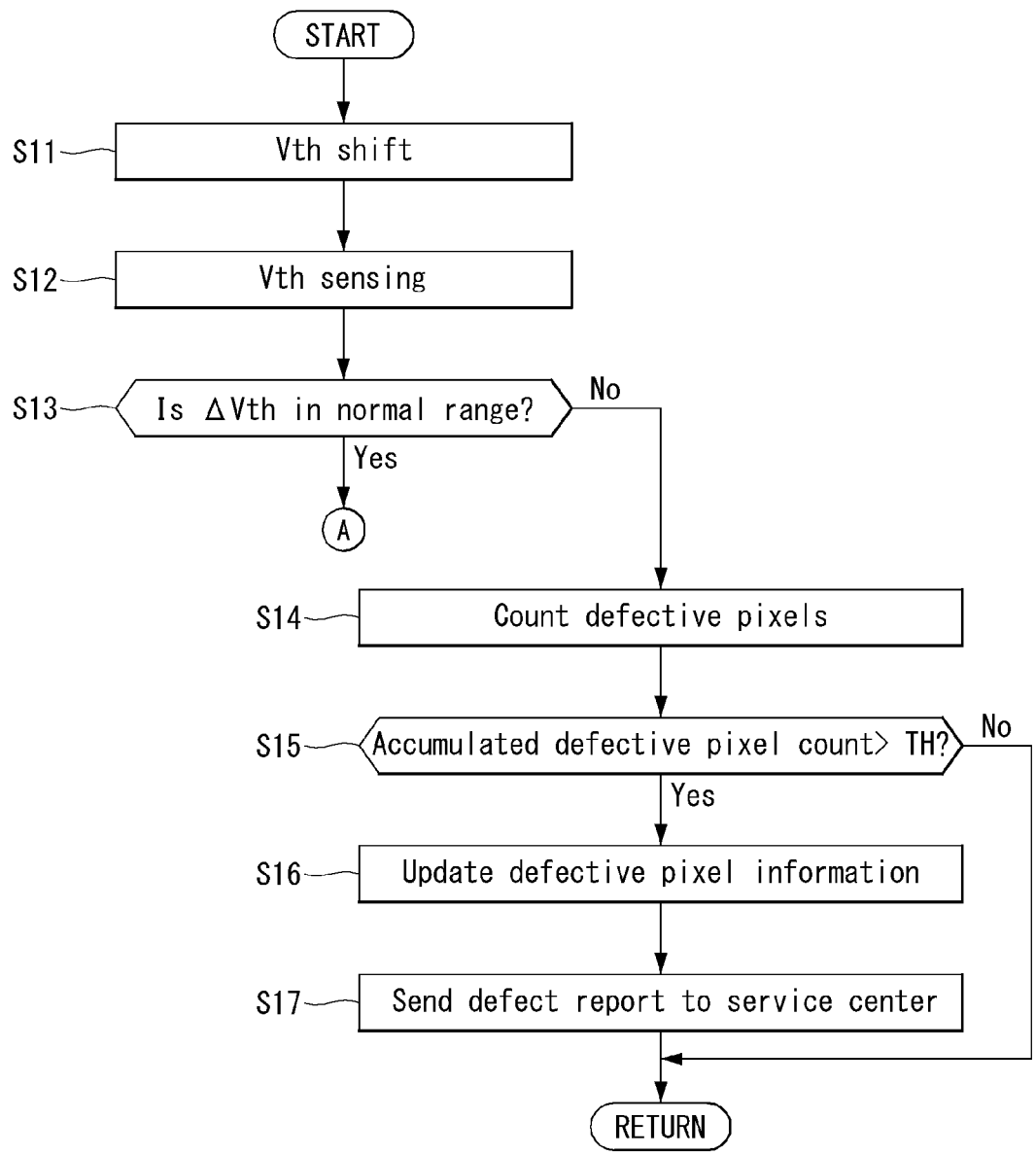
FIG. 8 is a flowchart showing a method of managing defective pixels after product shipment, in an electroluminescence display according to an exemplary aspect of the present disclosure.
Figure 9:
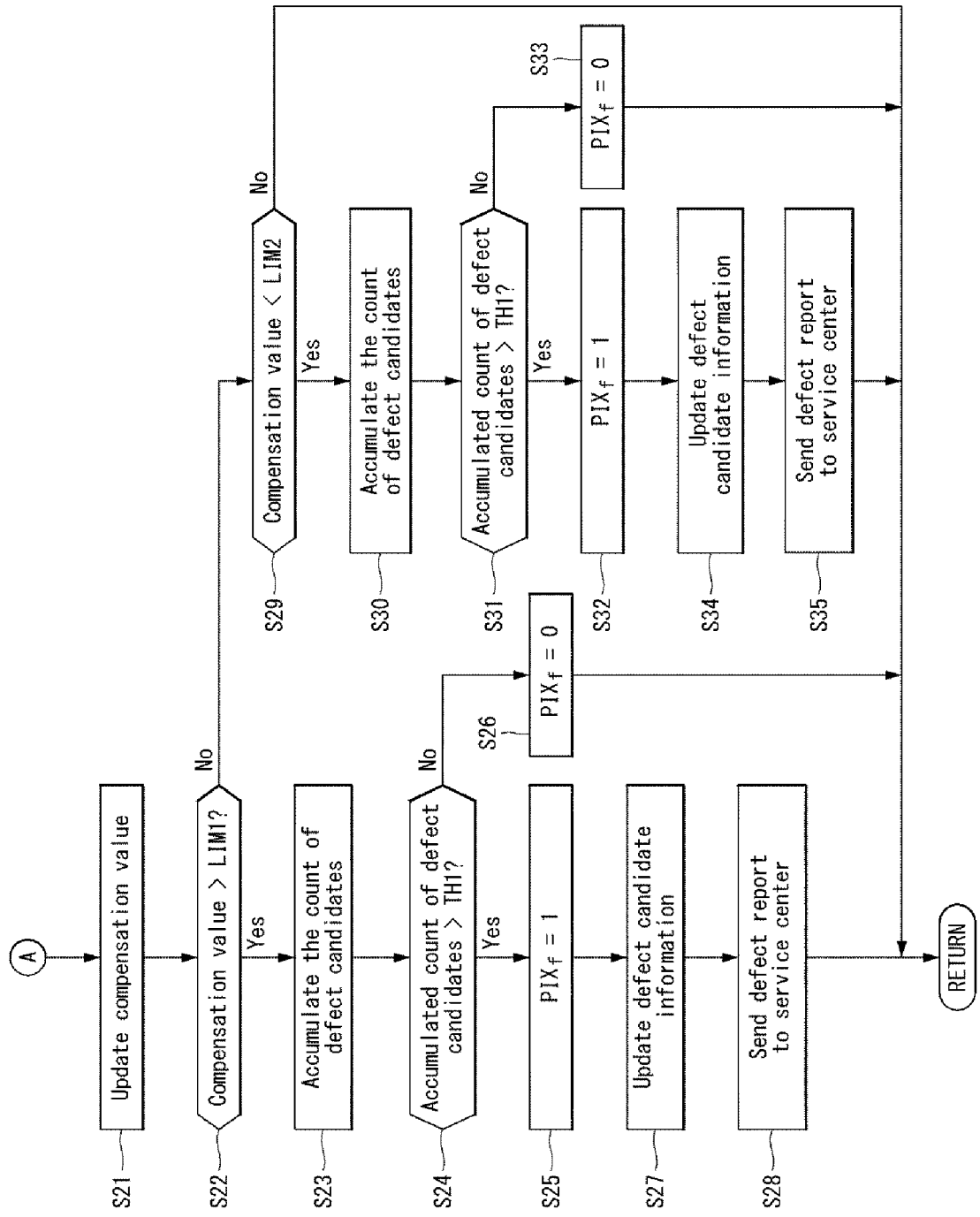
FIG. 9 is a flowchart showing in detail a method of managing defective pixels if the amount of variation in the threshold voltage of a driving element is within a normal, compensable range in FIG. 8.

FIG. 7 is a flowchart showing a method of managing defective pixels before product shipment, in an electroluminescence display according to an exemplary aspect of the present disclosure. FIG. 8 is a flowchart showing a method of managing defective pixels after product shipment, in an electroluminescence display according to an exemplary aspect of the present disclosure. FIG. 9 is a flowchart showing in detail a method of managing defective pixels if the amount of variation in the threshold voltage of a driving element is within a normal, compensable range in FIG. 8.

Referring to FIGS. 7 to 9, the external compensation circuit 103, 111, and 131 detects defective pixels based on sensing results on the threshold voltage Vth of the driving elements in the sensing mode before product shipment, and stores defective pixel information in the non-volatile memory 132b (S01 to S02). If the number of detected defective pixels is greater than a predetermined reference value TH for defect management, the corresponding product is discarded (S03 to S04). If the number of detected defective pixels is less than the reference value for TH for defect management, the corresponding product is shipped with its defective pixel information stored in the non-volatile memory 132b.

A display module maker may provide a display module comprising a display panel and its drive circuit to a set maker. The set maker connects the host system to the display module provided from the display module maker. The display module maker may store defective pixel information generated before shipment in the non-volatile memory 132b and provide it to the set maker.

Referring to FIG. 8, as stress on the driving elements DT accumulates, depending on the history of pixel driving after product shipment, the threshold voltage Vth of the driving elements DT may be shifted (S11).

The external compensation circuit 103, 111, and 131 senses the threshold voltage Vth of the driving element DT in each subpixel and determines whether the amount ΔVth of variation in the threshold voltage of the driving element DT in each subpixel is within a normal range or not (S12 and S13). Each subpixel's compensation value is determined in proportion to the amount of variation in the threshold voltage of the driving element DT which is sensed for each subpixel. Each pixel's compensation value is updated based on real-time sensing results. The normal range refers to the amount of variation in the threshold voltage of the driving element DT by which a shift in the threshold voltage of the driving element DT can be compensated for. An abnormal range beyond the normal range means that the driving element DT has progressed to such an extent that a shift in the threshold voltage of the driving element DT cannot be compensated for. In the abnormal range, the shift in the threshold voltage of the driving element DT cannot be compensated for by a compensation value which is within the normal range.

In step S13, if the amount ΔVth of variation in the threshold voltage of the driving element DT in each subpixel is sensed to be in the abnormal range, the corresponding subpixel is counted as a defective pixel and defective pixel information is updated (S14). If the accumulated defective pixel count is greater than a predetermined reference value TH for defect management, a defect flag of '1' occurs, defective pixel information reflecting this defect flag is updated, and a defect report is sent to the service center 300 (S15, S16, and S17). Defective pixel information may be attached to the defect report.

Referring to FIG. 9, in step S13, the amount ΔVth of variation in the threshold voltage of the driving element DT in each subpixel may be sensed in a normal, compensable range. In this case, a compensation value determined based on the sensing results on the threshold voltage Vth is compared with a first threshold LIM1 and a second threshold LIM2. The first threshold LIM1 may be set to a certain value smaller than an upper limit compensation value in the normal range, and the second threshold LIM2 may be set to a certain value greater than a lower limit compensation value in the normal range. The first threshold LIM1 is a value greater than the second threshold LIM2. The thresholds LIM1 and LIM2 may be properly selected according to a defect management policy and display panel characteristics.

As the light emission time of the pixels elapses, the driving elements DT get positive stress and its threshold voltage Vth is shifted toward positive voltage. A positive shift in the threshold voltage Vth of the driving element DT increases the compensation value, and the compensation part 131 compares the updated compensation value with the first threshold value LIM1 based on the sensing results (S21 and S22). If the compensation value is greater than the first threshold LIM1, the corresponding subpixel is highly likely to develop into a defective pixel defect.

In the case of non-light-emitting pixels (or subpixels), the driving element DT gets negative stress and its threshold voltage Vth is shifted toward negative voltage. A negative shift in the threshold voltage Vth of the driving element DT decreases the compensation value. If the compensation value is smaller than the second threshold value LIM2, the corresponding subpixel is highly likely to develop into a defective pixel defect. The compensation part 131 compares the updated compensation value with the second threshold value LIM2 based on the sensing results (S21 and S29).

In the present disclosure, the compensation value based on the real-time sensing results is compared with the first and second thresholds LIM1 and LIM2, and pixels (or subpixels) that are highly likely to develop into dark or bright dot defects due to a positive shift in threshold voltage Vth are counted as "defective pixels" and the count is accumulated (S23 and S30).

If the accumulated count of defect candidates is greater than a reference value TH1 for defect management, a defect predicting flag PIXf turns into 1, and defect candidate information is updated based on this defect flag PIXf (S24, S25, S27, S31, S32, and S34). When a defect flag PIXf=1 occurs, a defect report may be automatically sent to the service center 300 (S28 and S35). Defect candidate information may be attached to the defect report. In steps S24 and S31, if the accumulated count of defect candidates is smaller than the reference value TH1 for defect management, the defect predicting flag PIXf remains at 0 (zero) (S26 and S33).

When a defect flag PIXf occurs, a defect report message may be displayed on the screen of the display panel 100 to inform the user of this. If the accumulated count of defect candidates is smaller than the reference value TH1 for defect management, the defect predicting flag PIXf remains at 0.

As described above, in the present disclosure, defective pixels and candidate defective pixels that are highly likely to develop into dark or bright dots or defective pixels may be detected in real time based on real-time sensing results on variations in the electrical characteristics of driving elements. Accordingly, the present disclosure allows for real-time detection of candidate defective pixels and defective pixels in an electroluminescence display after product shipment and also allows for updating defective pixel information stored in memory based on real-time sensing results on the driving elements.

In the present disclosure, if the number of defective pixels or candidate defective pixels detected based on real-time sensing results on the driving element exceeds a reference value for defect management, a defect report may be automatically sent to a service center, or the user may be informed of the current defect level of the product by displaying a defect report message on the screen.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescence display comprising:
a display panel comprising data lines, gate lines intersecting the data lines, and pixels having a plurality of sub-pixels and each comprising a driving element for driving a light-emitting diode;
a compensation part detecting defective pixels from the pixels, based on sensing results on electrical characteristics of the driving element in each of the plurality of sub-pixels, obtained by a sensing part connected to the driving element in real time; and
a memory storing defective a defective pixel information on the defective pixels,
wherein the defective pixel information further includes positions of the defective pixels or the number of the defective pixels,
wherein the compensation part updates a compensation value based on the sensing results, and, if the number of the defective pixels is greater than a reference value for defect management, a defect flag occurs, and
wherein the electroluminescence display generates a defect report based on the defect flag.

2. The electroluminescence display of claim 1, wherein, when the defect flag occurs, the defect report is sent to an external service center via a wired/wireless network.

3. The electroluminescence display of claim 2, wherein the defect report includes the defective pixel information.

4. The electroluminescence display of claim 1, wherein the defective pixel information includes a progressive defect information that is compensated with a compensation value based on the sensing results.

5. The electroluminescence display of claim 1, wherein, when the defect flag occurs, the defect report message is displayed on a screen of the display panel.

6. The electroluminescence display of claim 1, wherein the compensation part determines the pixel by comparing the sensing results on the electrical characteristics of the driving element in each sub-pixel with a preset threshold value if an amount of variation in the threshold voltage of the driving element is within a normal, compensable range, based on the sensing results on the electrical characteristics of the driving element in each of the subpixels, obtained by the sensing part.

7. The electroluminescence display of claim 6, wherein the compensation part compares the compensation value based on the sensing results on the electrical characteristics of the driving element with a first threshold value and accumulates a count of the defective pixel if the compensation value is greater than the first threshold value.

8. The electroluminescence display of claim 7, wherein the compensation part compares the compensation value with a second threshold value smaller than the first threshold value and accumulates the count of the defective pixel and updates information on the defective pixel if the compensation value is smaller than the second threshold value, and issues a defect predicting flag if the accumulated count of the defective pixel is greater than a reference value for defect management.

9. The electroluminescence display of claim 8, wherein, when the defect predicting flag occurs, a defect report is sent to an external service center via a wired/wireless network.

10. The electroluminescence display of claim 9, wherein, when the defect predicting flag occurs, a predetermined defect report message is displayed on a screen of the display panel.

11. The electroluminescence display of claim 10, wherein the defect report includes a progressive defect information that is compensated with the compensation value based on the sensing results.

12. An electroluminescence display comprising:
a display panel comprising a plurality of pixels each including a plurality of sub-pixels, and each pixel comprising a driving element for driving a light-emitting diode;
a sensing part connected to the driving element and sensing electrical characteristics of the driving element in each of the plurality of sub-pixels in real time;
a compensation part detecting defective pixels among the plurality of pixels based on sensing results, updating a compensation value based on the sensing results, and generating a defect flag on the display panel if the number of the defective pixels is greater than a reference value for defect management; and
a memory storing a defective pixel information on the defective pixels including positions of the defective pixels or the number of the defective pixels,
wherein the electroluminescence display generates a defect report based on the defect flag.

13. The electroluminescence display of claim 12, wherein the compensation part sends the defect report to an external service center via a wired/wireless network when the defect flag is generated.

14. The electroluminescence display of claim 12, wherein the compensation part determines the defective pixel by comparing the sensing results on the electrical characteristics of the driving element in each sub-pixel with a preset threshold value if an amount of variation in the threshold voltage of the driving element is within a normal, compensable range, based on the sensing results on the electrical characteristics of the driving element in each of the subpixels, obtained by the sensing part.

15. The electroluminescence display of claim 14, wherein the compensation part compares the compensation value based on the sensing results on the electrical characteristics of the driving element with a first threshold value and accumulates a count of the defective pixel if the compensation value is greater than the first threshold value.

16. The electroluminescence display of claim 15, wherein the compensation part compares the compensation value with a second threshold value smaller than the first threshold value and accumulates the count of the defective pixel and updates the defective pixel information on the defective pixel if the compensation value is smaller than the second threshold value, and issues a defect predicting flag if the accumulated count of the defective pixel is greater than a reference value for defect management.

17. The electroluminescence display of claim 16, wherein the display panel displays a predetermined defect report message when the defect predicting flag occurs.

18. The electroluminescence display of claim 12, wherein the defective pixel information includes a progressive defect information that is compensated with a compensation value based on the sensing results.

19. An electroluminescence display comprising:
a display panel comprising data lines, gate lines intersecting the data lines, and pixels each comprising a driving element for driving a light-emitting diode;
a compensation part that sets a compensation value, based on sensing results on electrical characteristics of the driving element in each of subpixels of the pixels, obtained by a sensing part connected to the driving element, and selects potential defective pixels among the pixels within a compensation range in which the electrical characteristics of the driving element can be compensated by the compensation value; and
a memory storing a potential defective pixels information comprising the number of the potential defective pixels or positions of the potential defective pixels,
wherein the compensation part updates the compensation value based on the sensing results, and, if the number of the potential defective pixels is greater than a reference value for defect management, a defect flag occurs, and
wherein the electroluminescence display generates a defect report based on the defect flag.

20. The electroluminescence display of claim 19, wherein the defective pixel information includes a progressive defect information that is obtained from the potential defective pixels and compensated with a compensation value based on the sensing results.

21. A method of managing defective pixels on an electroluminescence display comprising a display panel comprising data lines, gate lines intersecting the data lines, and pixels each comprising a driving element for driving a light-emitting diode, the method comprising:
detecting defective pixels from the pixels, based on sensing results on the electrical characteristics of the driving element;
setting a compensation value, based on the sensing results on the electrical characteristics of the driving element, and selecting defect candidates from among the pixels within a compensation range in which the electrical characteristics of the driving element can be compensated by the compensation value; and
storing a defective pixel information including positions of the a defective pixels or the number of the potential defective pixels,
wherein the compensation value is updated based on the sensing results, and, if the number of the potential defective pixels is greater than a reference value for defect management, a defect flag occurs, and
wherein the electroluminescence display generates a defect report based on the defect flag.

22. The method of claim 21, wherein the defective pixel information includes a progressive defect information that is obtained from the potential defective pixels and compensated with a compensation value based on the sensing results.

* * * * *